United States Patent [19]
Gleason et al.

[11] Patent Number: 6,012,713
[45] Date of Patent: Jan. 11, 2000

[54] REFLOW PALLET WITH LEVER ARM

[75] Inventors: James Gleason, Garland; Hassan Nemat, Plano, both of Tex.

[73] Assignee: Gleason Service Company, L.C., Garland, Tex.

[21] Appl. No.: 09/220,106

[22] Filed: Dec. 23, 1998

[51] Int. Cl.[7] .................................................. B23Q 1/00
[52] U.S. Cl. ........................... 269/47; 269/54.4; 269/54.5
[58] Field of Search ........................... 269/47, 54.4, 54.5, 269/303

[56] References Cited

U.S. PATENT DOCUMENTS

| | | | |
|---|---|---|---|
| 3,738,639 | 6/1973 | Berlyn | 269/317 |
| 4,201,374 | 5/1980 | Gras | 269/37 |
| 4,425,076 | 1/1984 | Colineua | 414/781 |
| 4,582,309 | 4/1986 | Moxon | 269/303 |
| 4,593,804 | 6/1986 | Kinsey | 193/41 |
| 4,684,113 | 8/1987 | Douglas | 269/21 |
| 5,501,436 | 3/1996 | Miller | 269/47 |
| 5,692,666 | 12/1997 | Dallas | 227/154 |

*Primary Examiner*—Timothy V. Eley
*Assistant Examiner*—Benjamin M. Halpern
*Attorney, Agent, or Firm*—Rudolf O. Siegesmund

[57] ABSTRACT

An apparatus comprising a pallet for holding a printed circuit board during the solder stenciling process wherein the printed circuit board is held by means of one or more lever arms cut from the pallet material so that pressure is exerted by the arm or arms against the printed circuit board by compression or through tension by the addition of a pin to the lever arm.

13 Claims, 3 Drawing Sheets

REFLOW PALLET WITH LEVER ARM

FIELD OF THE INVENTION

The present invention is directed, in general, to a pallet with a lever arm for accurately positioning and holding a printed circuit board during the solder stenciling process.

BACKGROUND OF THE INVENTION

During the manufacture of printed circuit boards there exists a need for a means to accurately hold a printed circuit board in position during various steps in the manufacturing process including a step known as solder stenciling. Solder stenciling requires that the printed circuit board be placed within a solder stenciling machine where a portion of the solder stenciling machine is lowered onto the printed circuit board from above in order to deposit solder onto the copper leads of the printed circuit board. In order to hold the printed circuit board in position during the solder stenciling process, pallets are made by machining a suitable material to create a recessed space in the pallet for receiving the printed circuit board. The pallets will vary in size and thickness depending on the size of the printed circuit board which the pallet is to hold. When positioned within the recessed space the printed circuit board lies flat and level with or beneath the plane of the top surface of the pallet. The printed circuit board must be held in position so that it does not move from side to side or move upward and out of the recessed space. If the board were to bend, the position of the copper leads to receive solder would be moved and the process would not be properly accomplished. Therefore, a way to apply pressure to the printed circuit board to hold it in place without deformation is needed. Clamps which protrude above the surface of the top of the pallet will not work for solder stenciling because the solder stenciling process requires that the stencil machine come down directly over the printed circuit board and then lift up after depositing the solder paste. The solder and the machine will exert a slight suction or adhesion which can lift the board up out of the recessed cavity if the pallet does not have a means to hold the board in position.

Since pallets must be designed for each specific size and type of printed circuit board to be manufactured and since the pallets are reused numerous times, an apparatus for positioning and holding the printed circuit board that is simple, reliable, easy to manufacture and inexpensive is needed.

One example of the present methods of holding the printed circuit board in position during the solder stenciling process are pallets made by Precision International, Ltd. Precision International, Ltd. makes pallets in which a cavity is cut for holding a spring. A lid is placed over the spring and screwed shut so that the spring is contained inside the pallet and the top surface of the pallet is flat. The spring then applies pressure to the printed circuit board. This device, while effective, requires extra steps in the manufacturing process and extra handling for assembly. A need exists for an apparatus for holding the printed circuit board in place without the additional parts and the additional manufacturing steps entailed in the Precision International, Ltd. pallet.

U.S. Pat. No. 3,738,639 discloses a coiled spring attached to a base which holds the substrate against a fixed stop. The coiled spring does not meet the need for a pallet without additional parts and assembly steps.

U.S. Pat. No. 4,201,374 discloses a substrate carrier with spring arms for positioning the substrate with the hooked ends of the spring arms. The spring arms are engaged to an external actuating means for retracting and inserting the arms. Like the coiled spring discussed above, the apparatus, if applied to a reflow pallet, does not meet the need for a reflow pallet without additional parts and assembly steps.

U.S. Pat. No. 4,425,076 discloses a process and apparatus for automatic positioning of a substrate on a worktable. The patent discloses two pivoting arms driven by a motor for positioning a work piece. The apparatus is too complicated for economical application in the solder stenciling process.

U.S. Pat. No. 4,582,309 discloses jigs for locating and holding circuit boards in a desired location by means of four accurately formed holes on the printed circuit board which align with pins in the jig, one of which pins is chamfered to align with one corner of the board. The pins are directed to a different assembly step than reflow soldering and while the pins provide stability in the horizontal plane they do not provide stability in the vertical plane. Moreover, the pins protrude above the printed circuit board and are therefore not suitable for reflow soldering.

U.S. Pat. No. 4,593,804 discloses an apparatus for guiding a circuit board onto a test fixture by means of a circuit board holder with guide pins that protrude upward above the printed circuit board. The pins do not provide stability in the vertical plane and since they protrude above the printed circuit board are not suitable for a pallet to hold a printed circuit board during the reflow soldering process.

U.S. Pat. No. 4,684,113 discloses a universal holding fixture where the workpiece is supported by rods through which a holding force is generated by a vacuum. While the holding force solves the problem of stabilizing the printed circuit board in the vertical plane, the addition of a machine to generate a vacuum makes this apparatus unsuitable for a reflow pallet that is easy to manufacture and inexpensive.

None of the above disclosures meet the need for a device that can simultaneously hold a printed circuit board in both the horizontal and vertical planes without without parts that protrude above the surface of the printed circuit board and without additional costly assembly steps in the manufacture of the reflow pallet.

Therefore, a need exists for a reflow pallet that is inexpensive to manufacture, easy to use, reliable, accurate, reusable, capable of properly aligning the printed circuit board and capable of stabilizing the printed circuit board in both the horizontal and vertical planes.

SUMMARY OF THE INVENTION

An apparatus meeting the needs identified above comprises a pallet for holding a printed circuit board during the solder stenciling process wherein the printed circuit board is held by means of one or more lever arms cut from the pallet material so that pressure is exerted by the arm or arms against the printed circuit board by compression or through tension by the addition of a pin to the lever arm.

In one embodiment using compression, the lever arm is cut from the pallet material so that it contains an abutment to press against the side of the printed circuit board. The person inserting the printed circuit board into the pallet places one edge of the printed circuit board into the recessed space so that the edge of the printed circuit board presses against the lever arm. The opposite edge of the printed circuit board is lowered into the recessed cavity. The opposite edge of the printed circuit board may contain one or more holes for mating with pins placed in the recessed cavity. Pins may be placed inside a cavity in the pallet for receiving the printed circuit board to ensure accurate and fool proof positioning of the printed circuit board and to further stabilize the board. Because the arm is cut from the same material as the pallet no additional parts or assembly are necessary with the sole exception of pins that are positioned for mating with holes on the printed circuit board or on flanges attached to the printed circuit board. Compression is suitable for thick and heavy printed circuit boards. However, thin, light printed circuit boards may be bent by compression resulting in a distortion of the circuit coordinates on the face of the board.

In the preferred embodiment of the invention a pin is placed in the lever arm for mating with a hole in the printed circuit board or for mating with a hole in a flange removably attached to the printed circuit board. By placing a pin in the lever arm tension can be used to hold the printed circuit board firmly in position. In the version with a pin in the lever arm the person inserting the printed circuit board into the pallet manually inserts the printed circuit board into the recessed space cut into the pallet and places a finger into the space cut next to the arm, in order to slightly bend the arm towards the printed circuit board until the pin is positioned into the hole in the printed circuit board or on the flange attached to the printed circuit board. When the pin is seated and the arm released, the arm and pin will exert tension on the printed circuit board thereby holding the printed circuit board in position within the recessed space of the pallet. Only slight pressure is necessary. The tension created by the lever arm with a pin solves the potential problem of an arm using compression causing the board to bend slightly altering the coordinates of the copper leads. The pressure from the lever arm pulls the board flat and further stabilizes the printed circuit board in the vertical plane as well by increasing the pressure necessary to lift the board out of the pallet. The arm can be cut to work for any size board and the pressure can be adjusted by varying the length and thickness of the lever arm. Any number of arms can be cut in the pallet as necessary depending of the size and shape of the printed circuit board.

BRIEF DESCRIPTION OF THE DRAWINGS

The apparatus of the invention is further described and explained in relation to the following figures of the drawings wherein.

DESCRIPTION OF PREFERRED EMBODIMENTS

Figure 1:
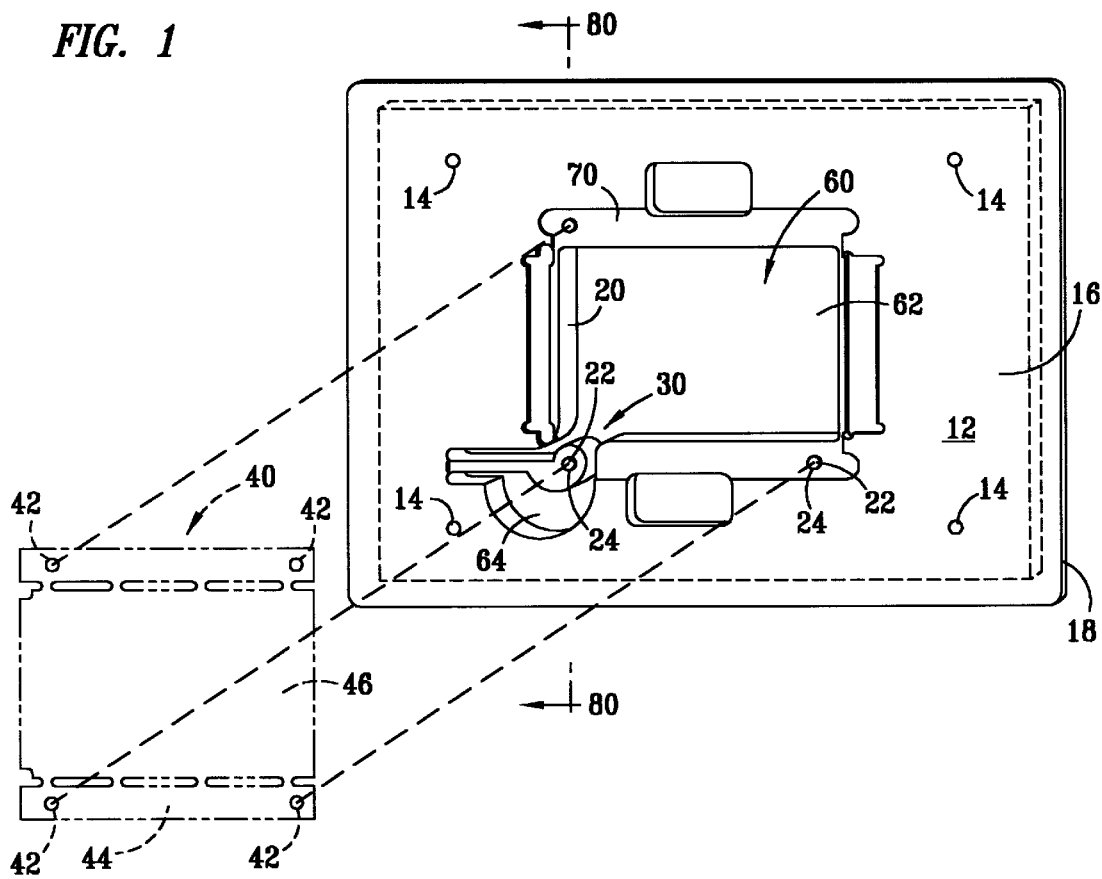
FIG. 1 A front perspective of the reflow pallet with the printed circuit board exploded out and in alignment with the mounting pins by phantom outline.

In the discussion of the figures, the same numbers will be used to refer to the same or similar components throughout. According to the present invention, FIG. 1 depicts the apparatus 10 as seen from above with printed circuit board 40 positioned above and ready to be positioned onto the apparatus 10. The printed circuit board 40 has a center section on which the printed circuits are placed and two flanges 44 rigidly and removably attached to the printed circuit board. In printed circuit board 40, each of the two flanges 44 contains two holes 42. However, the printed circuit board could have no holes, one hole, or any number of holes. Printed circuit board 40 is representative of a circuit board with removable flanges. Some printed circuit boards have flanges which are not removable. Other printed circuit boards do not have any flanges at all and the hole or holes are in the board itself. The apparatus 10 comprises a pallet 12 from which an interior space is cut and from which several cavities of varying depths are machined. Pallet 12 has top surface 16 which is smooth, planar and level, and outside wall 18 and inside wall 20. Inside wall 20 defines interior space 60 with first space 62 and second space 64. Inside wall 20 continues until interrupted by arm 30. A portion of inside wall 20 continues over arm 30. Inside wall 20 is formed by cutting out interior space 60 with a suitable tool. In the preferred embodiment, the most suitable tool is an end mill. First space 62 will be shaped to conform to the shape of the printed circuit board 40. In the preferred embodiment first space 62 is rectangular. However, first space 62 could be any shape to conform to the shape of the printed circuit board. For example, first space 62 could be square, circular, hexagonal, octagonal and so forth depending on the shape of the printed circuit board. Second space 64 is formed by cutting arm 30 from pallet 12 with a suitable tool such as an end mill. Top 34 of arm 30 is then shaved to a depth substantially equal to the thickness of printed circuit board 40. Arm 30 comprises longitudinal section 36 and elliptical section 32. The width of longitudinal section 36 is approximately one-half the depth of arm 30. The dimensions of arm 30 will vary depending on the size and thickness of the printed circuit board. For a rectangular printed circuit board such as printed circuit board 40 first space 64 is rectangular and second space 62 consists of straight and circular sections. Arm 30 may be cut differently for different printed circuit boards. The method of cutting the arm and selecting the dimensions of the arm is by trial and error. First, the approximate dimensions are entered into a computer numeric controlled end mill and a trial pallet is cut. The trial pallet is then tested with the printed circuit board. If the printed circuit board is properly positioned when seated on pins 22 and pin 22 in arm 30 exerts sufficient tension, then production of the pallets can begin. If the printed circuit board is not properly positioned or if the tension created by the combination of arm 30 and pin 22 is too small or too large, then the computer coordinates are adjusted accordingly and a new trial pallet is cut. The process is repeated until the printed circuit board is held by the arm with sufficient pressure to hold the printed circuit board in the horizontal plane and to restrain the printed circuit board in the vertical plane.

Pallet 12 has recess 70 at a depth below top surface 16 equal to the thickness of printed circuit board 40. Recess 70 is made for the purpose of receiving printed circuit board 40.

Pallet 12 has first cavity 80 which is generally rectangular in shape with a depth equal to ½ the width of pallet 12. The purpose of first cavity 80 is so that when printed circuit board 40 is positioned in recess 70 it can be grasped between the thumb and one of the other four fingers of the human hand by the inserting the fingers into the cavities and grasping the edges of flanges 44.

Pallet 12 has second cavities 90 with a depth ⅓ the thickness of pallet 12. The purpose of second cavity 90 is to allow insertion of plastic connectors for leads on printed circuit board 40.

Pallet 12 has holes 14 for use in the manufacturing of apparatus 10. These holes are optional and for convenience only.

Pallet 12 has holes 24 formed by drilling completely through pallet 12. Alternatively, holes 24 may be drilled to any depth desired without going completely through pallet 12. The depth of hole 24 is sufficient if it is capable of holding pin 22. Arm 30 has hole 24 drilled completely through arm 30. Alternatively, hole 24 may be drilled to any depth desired without going completely through arm 30. The depth of hole 24 is sufficient if it is capable of holding pin 22. Pins 22 are inserted into holes 24 so that the tops of pins 22 lie approximately in the same plane as the top surface of pallet 12. The tops of pins 22, when inserted into holes 24, must have sufficient height to enter the holes in printed circuit board. Pins 22 may protrude above printed circuit board 40 a small amount if the board is very thin and needs extra holding power. Pins 22 should not protrude more than $\frac{1}{16}$ inch above top surface 16 of pallet 12 or top surface 46 of printed circuit board 40 when printed circuit board 40 is properly seated in recess 70.

The pallet can be made from any suitable material. The suitable characteristics of material for apparatus 10 are that it be of high strength for durability in withstanding repeated handling and machine operations, be capable of withstanding high temperatures without deterioration or deformation so that it can be reused and also so that the fit and alignment are exactly the same each time, and that it not retain heat. Light weight is also desirable and low heat absorption makes it easier to handle. The material must be capable of being milled, drilled and tapped to exacting requirements. Composite Delmat meets all of the requirements. Another suitable material is Glastic CBC-C manufactured by Glastic, a subsidiary of Kobe Steel. CDM-ESD 68.610 made by von-Roll Isola includes composite Delmat.

Figure 2:
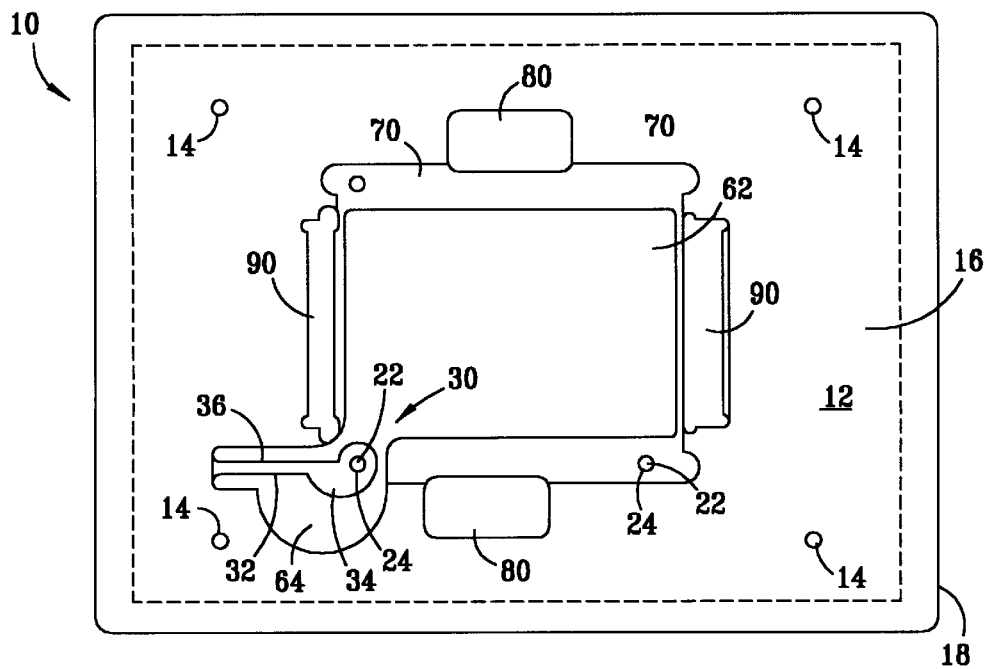
FIG. 2. A front perspective of the reflow pallet.

FIG. 2 depicts pallet 10 as seen from directly above. The positioning of pins 22 for mating with holes 42 in printed circuit board 40 ensures fool proof alignment of printed circuit board 40 within pallet 10. Pin 22 in lever arm 30 is positioned so that slight pressure on lever arm 30 toward the center of pallet 10 is required in order to bring pin 22 in lever arm 30 into position for mating with corresponding hole 42 on printed circuit board 40.

Figure 3:
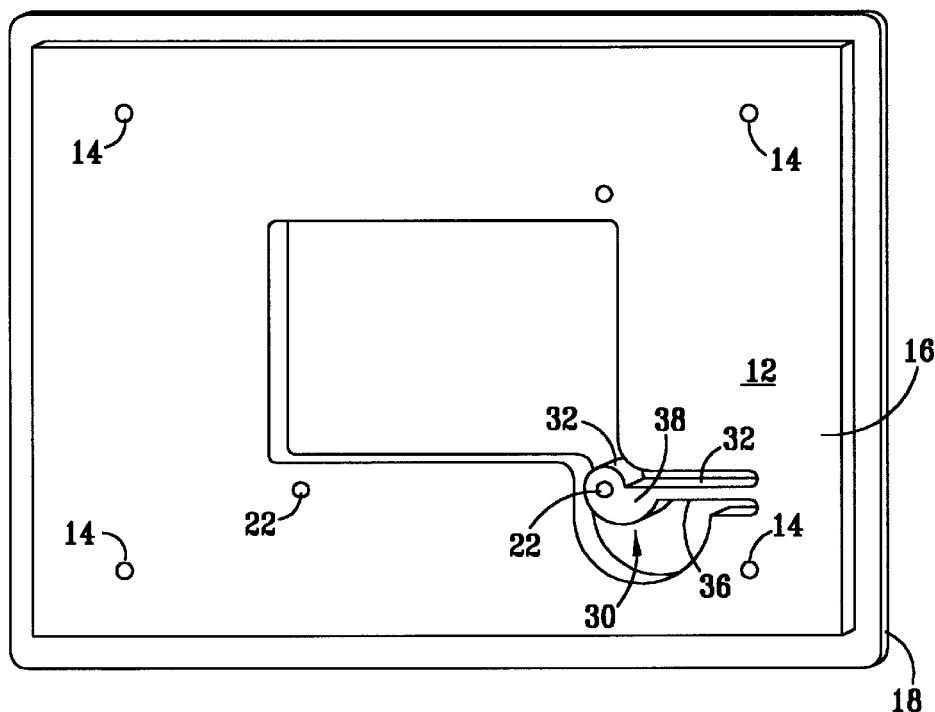
FIG. 3. A rear perspective of the reflow pallet.

FIG. 3 depicts pallet 12 as seen from the bottom. Pins 22 inserted in holes 24 are flush with the underside 18 of pallet 12. Underside 18 of pallet 12 is smooth and planar. It is not necessary for holes 24 to extend all the way through pallet 12.

Figure 4:
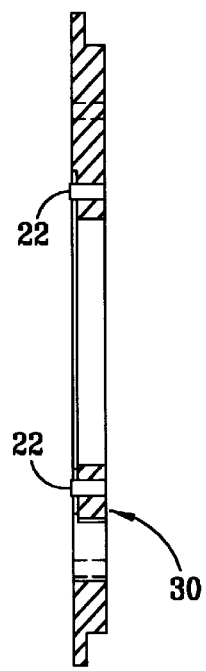
FIG. 4. A section view taken along a line 3—3 of FIG. 1 through the pins.

FIG. 4 is a cross sectional view of pallet 12 taken across line 80. FIG. 4 shows tops of pins 22 flush with underside 18 and in approximately the same plane as top surface 16 of pallet 12. Pins 22 may extend slightly above top surface 16; however, such extension should not exceed $\frac{1}{16}$th inch.

Figure 5:
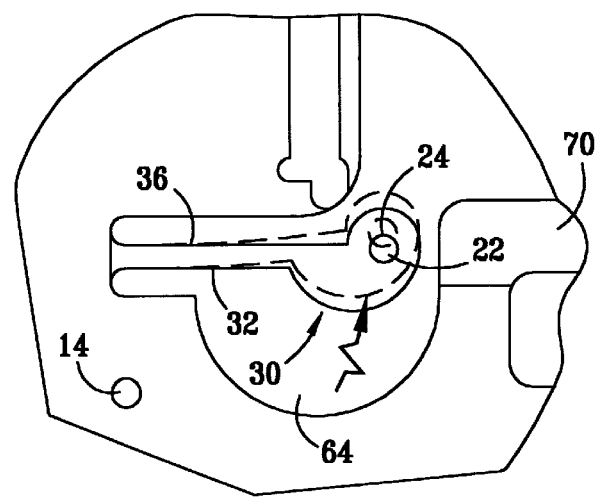
FIG. 5. An enlarged partial elevation view of the flexible lever arm showing the flex in dashed outline.

FIG. 5 is a detailed view of lever arm 30 showing how lever arm 30 can flex in the horizontal plane. By inserting a finger into second space 64 and pressing against lever arm 30, pin 22 can be moved until it aligns with hole 42 in printed circuit board 40. FIG. 5 shows lever arm 30 moved in the direction of the printed circuit board. Movement of arm 30 is effected by placing a finger in space 64 and pressing against arm 30 to push arm 30 toward the printed circuit board until pin 22 in arm 30 mates with the corresponding hole in the printed circuit board.

Figure 6:
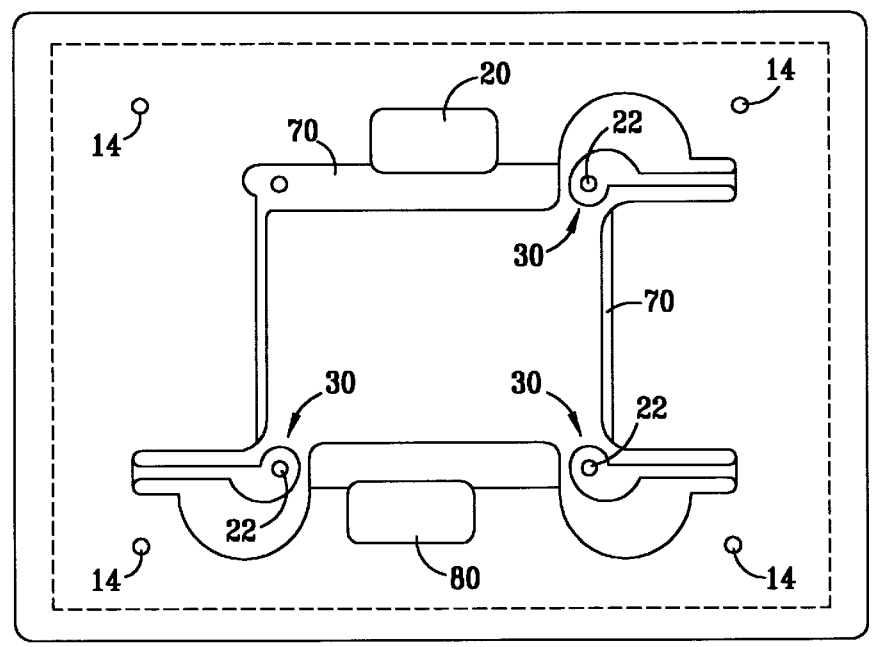
FIG. 6. A front perspective of a reflow pallet with two lever arms.

FIG. 6 shows a pallet with three lever arms 30. A pallet can be constructed with any number of lever arms in order to increase the amount of tension exerted on the printed circuit board. While the preferred embodiment for a square or rectangular printed circuit board would have one lever arm 30, the pallet could have any number of lever arms though more than four would be impractical in most situations. If the printed circuit board were octagonal then the number of lever arms could be eight. One reason for having multiple arms would be for a very thin printed circuit board in order to pull the board flat to ensure that there is no distortion of the position of the copper leads.

Figure 7:
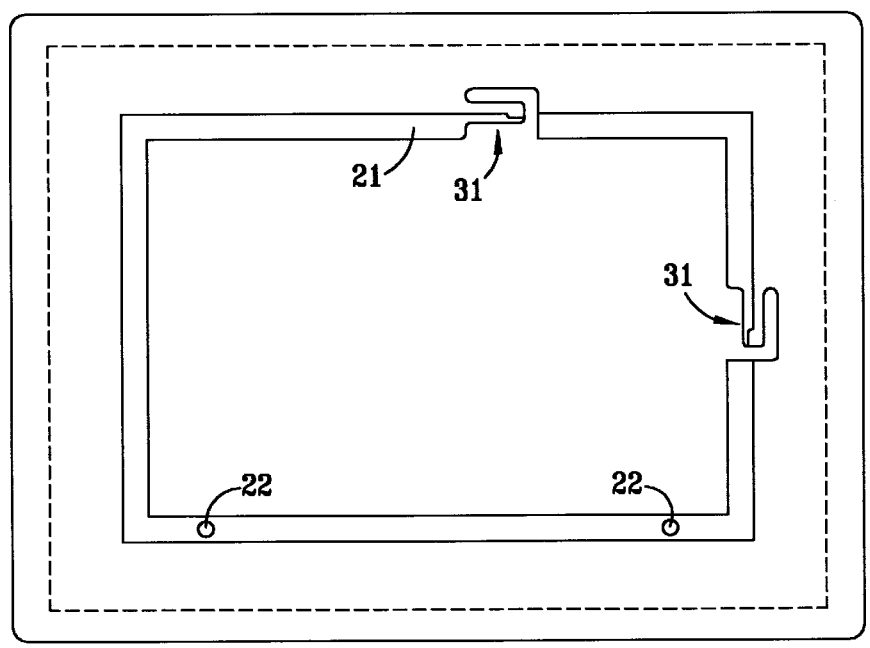
FIG. 7. A front perspective of a reflow pallet with a lever without pins.

FIG. 7 shows a pallet with lever arm 31 that does not utilize pin 22. Instead arm 31 is cut from the pallet material so that the arm contains a recessed space 21 corresponding to recess space 20 and abutment 35 at the end of lever arm 31. In the embodiment shown, abutment 35 is approximately $\frac{1}{4}$ the length of lever arm 31 and extends into recessed space 21 a distance approximately $\frac{1}{4}$ the width of lever arm 31. The height of abutment 35 is equal to the height of lever arm 31 and is the same as the thickness of pallet 11. However, the length and thickness of abutment 35 may vary based upon the pressure necessary to hold the printed circuit board in position which in turn depends on the size and thickness of the printed circuit board. Arm 31 is cut in the same manner as arm 30 by utilizing an end mill. Arm 31 may be cut differently for different printed circuit boards. Any number of arms 31 may be cut depending on the size and shape of the printed circuit board. FIG. 7 shows two arms 31. The method of cutting the arm and selecting the dimensions of the arm is by trial and error. First, the approximate dimensions are entered into a computer numeric controlled end mill and a trial pallet is cut. The trial pallet is then tested with the printed circuit board. If the printed circuit board is properly positioned and held then production of the pallets can begin. If the printed circuit board is not properly positioned and held then the computer coordinates are adjusted accordingly and a new trial pallet is cut. The process is repeated until the printed circuit board is held by the arm with sufficient pressure to hold it in position in the horizontal plane and to restrain the printed circuit board in the vertical plane. Lever arm 31 requires material of the same suitable characteristics as discussed above for lever arm 30.

Figure 8:
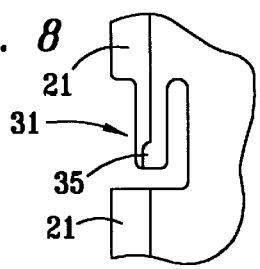
FIG. 8. An enlarged partial elevation view of another embodiment of the lever arm.

FIG. 8 shows an enlarged view of lever arm 31. The detailed view shows how abutment 35 extends into recessed cavity 21 so that when printed circuit board 40 is inserted into recessed cavity 31 the edge of printed circuit board 40 will force back lever arm 31 creating compression that will hold printed circuit board 40 in position.

Those skilled in the art should appreciate that the conception and the specific embodiment disclosed may be readily utilized as a basis for modifying or designing other structures for carrying out the same purposes of the present invention. Those skilled in the art should also realize that such equivalent constructions do not depart from the spirit and scope of the invention as set forth in the appended claims. Other alternatives and modifications of the invention will likewise become apparent to those of ordinary skill in the art upon reading the present disclosure, and it is intended that the scope of the invention disclosed herein be limited only by the broadest interpretation of the appended claims to which the inventor is legally entitled.

What is claimed:

1. An apparatus for positioning and holding a printed circuit board during a solder stencil process, said apparatus comprising:

a pallet having a recessed cavity for receiving the printed circuit board;

at least one arm fixedly and flexedly, connected to said pallet, wherein when the printed circuit board is placed into the recessed cavity, pressure from said arm when flexed holds the printed circuit board in said recessed cavity; and wherein said arm is cut from said pallet.

2. The apparatus of claim 1 wherein the printed circuit board has at least one hole for receiving a pin, said apparatus further comprising at least one pin for mating with said hole.

3. The apparatus of claim 1 wherein the pressure exerted by said arm is compression.

4. The apparatus of claim 1 wherein the pressure created by said arm is tension.

5. An apparatus for positioning and holding a printed circuit board having a plurality of holes during a solder stencil process, comprising:

a pallet having an outside wall, an inside wall and a recess cavity, said recess cavity having at least one pin wherein the pins in the recess cavity are positioned to align the printed circuit board; and at least one arm fixedly and flexedly connected to said inside wall, said arm having a pin positioned so that the arm must be moved in order for the pin in the arm to enter the hole in the printed circuit board;

wherein said arm is cut from said pallet.

6. The apparatus of claim 5 wherein the pressure exerted by said arm is compression.

7. The apparatus of claim 5 wherein the pressure created by said arm is tension.

8. The apparatus of claim 5 further comprising:

a pallet top surface; and an arm top surface wherein said arm top surface lies below the pallet top surface at a depth equal to the thickness of the printed circuit board.

9. The apparatus of claim 5 further comprising a plurality of first cavities.

10. The apparatus of claim 5 further comprising a plurality of second cavities.

11. The apparatus of claim 5, said pallet further comprising a hollow central portion having a first area and a second area wherein said first area has an opening into said second area; and wherein said second area surrounds said arm.

12. An apparatus for positioning and holding a printed circuit board having a plurality of holes for receiving a plurality of pins for positioning and holding of the board during the solder stencil process comprising:

a pallet having an outside wall and a hollow central portion defined by an interior wall;

said pallet having a recessed cavity for receiving said printed circuit board, said recessed cavity having a plurality of pins;

at least one arm fixedly and flexedly engaged to said interior wall; and at least one pin fixedly engaged in said arm;

wherein the holes in the printed circuit board receive the pins in the pallet and the arm and said lever arm can be moved in the horizontal plane of the pallet in order to align the pin in said arm with said hole in the printed circuit board thereby allowing insertion of the pin into the hole in the printed circuit board; and wherein said arm exerts tension on the printed circuit board to hold said printed circuit board in position;

wherein said arm is cut from said pallet.

13. The apparatus of claim 12 further comprising:

a plurality of first cavities;

a plurality of second cavities; and a hollow central portion having a first area and a second area wherein said first area has an opening into said second area; and wherein said second area surrounds said arm.

* * * * *